(12) United States Patent
Yonekawa

(10) Patent No.: US 10,228,624 B2
(45) Date of Patent: Mar. 12, 2019

(54) LITHOGRAPHY APPARATUS AND ARTICLE MANUFACTURING METHOD

(71) Applicant: CANON KABUSHIKI KAISHA, Tokyo (JP)

(72) Inventor: Masami Yonekawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/430,988

(22) Filed: Feb. 13, 2017

(65) Prior Publication Data

US 2017/0235234 A1    Aug. 17, 2017

(30) Foreign Application Priority Data

Feb. 17, 2016    (JP) .................................. 2016-028297

(51) Int. Cl.
    *G03F 7/20*    (2006.01)
    *G03F 7/00*    (2006.01)

(52) U.S. Cl.
    CPC ........ *G03F 7/70708* (2013.01); *G03F 7/0002* (2013.01); *G03F 7/70925* (2013.01)

(58) Field of Classification Search
    CPC .............................. G03F 7/20; G03F 7/70708
    USPC ..................................... 355/72–76; 361/234
    See application file for complete search history.

(56) References Cited

U.S. PATENT DOCUMENTS

| | | | |
|---|---|---|---|
| 7,558,045 B1 * | 7/2009 | Onate | H01L 21/67259 361/234 |
| 2010/0068659 A1 * | 3/2010 | Hamaya | G03F 7/70841 430/325 |
| 2012/0080820 A1 * | 4/2012 | Narioka | G03F 7/0002 264/293 |
| 2016/0236245 A1 * | 8/2016 | Lew | H01L 21/6831 |

FOREIGN PATENT DOCUMENTS

| | | |
|---|---|---|
| JP | 2014175340 A | 9/2014 |
| TW | 201637742 A | 11/2016 |

OTHER PUBLICATIONS

Masuda et al. "Electric Engineering in Japan." 1972:9-18. vol. 92.
Calle et al. "Dust Particle Removal by Electrostatic and Dielectrophoretic Forces with Applications to NASA Exploration Missions." Proc. ESA Annual Meeting on Electrostatics 2008, Paper O1.
Office Action issued in Taiwanese Application No. 106104126 dated Apr. 25, 2018. English translation provided.

* cited by examiner

*Primary Examiner* — Hung Nguyen
(74) *Attorney, Agent, or Firm* — Rossi, Kimms & McDowell LLP

(57) ABSTRACT

A lithography apparatus transfers a pattern of an original to a substrate. The apparatus includes an electrode structure arranged so as to surround a side surface of one of the substrate and the original, and a power supply configured to supply an alternating voltage to the electrode structure. The electrode structure includes a plurality of electrode groups electrically insulated from each other, each electrode group (Continued)

including a plurality of electrodes electrically connected to each other, and the power supply supplies alternating voltages having different phases to the plurality of electrode groups.

19 Claims, 11 Drawing Sheets

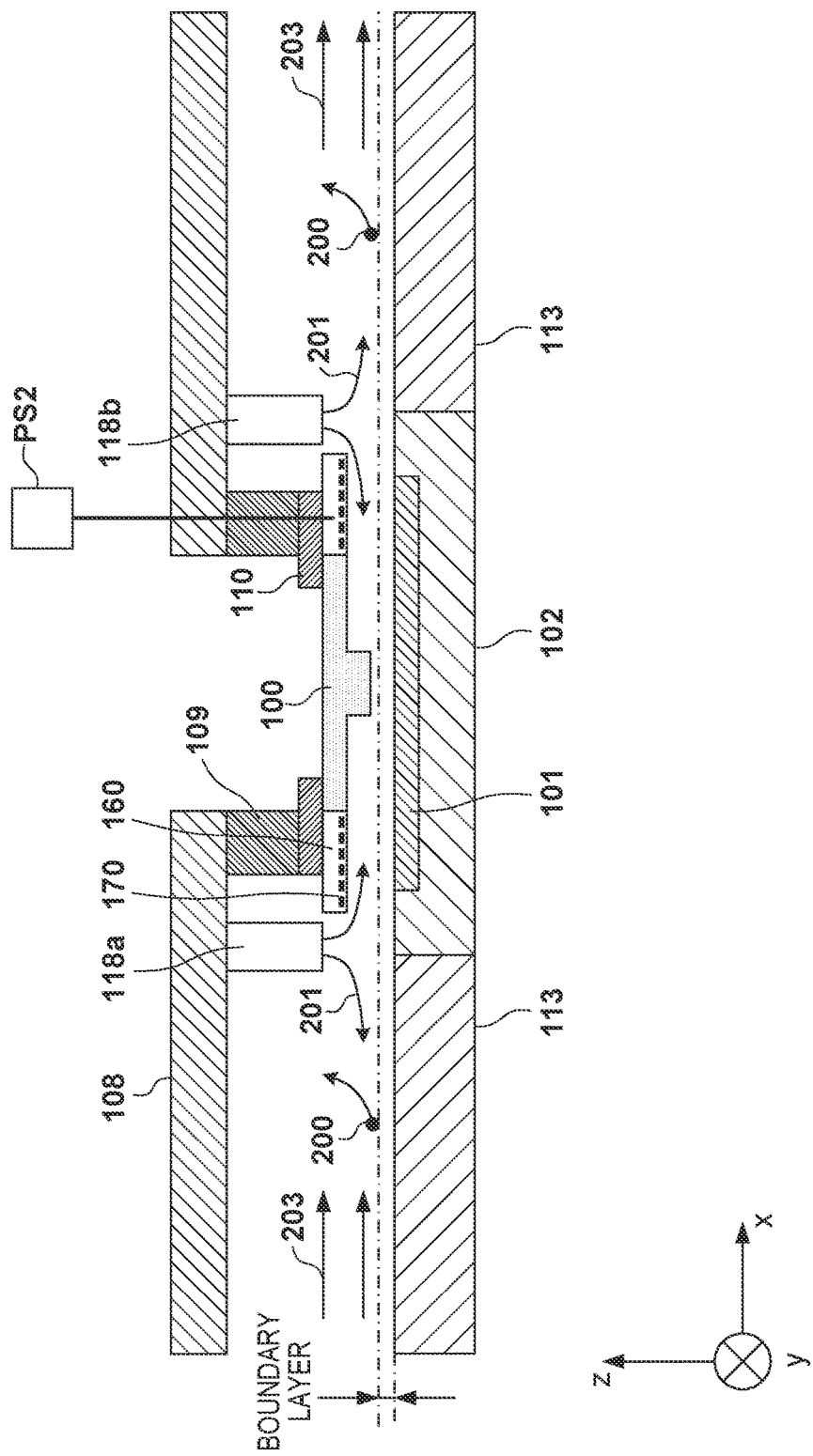

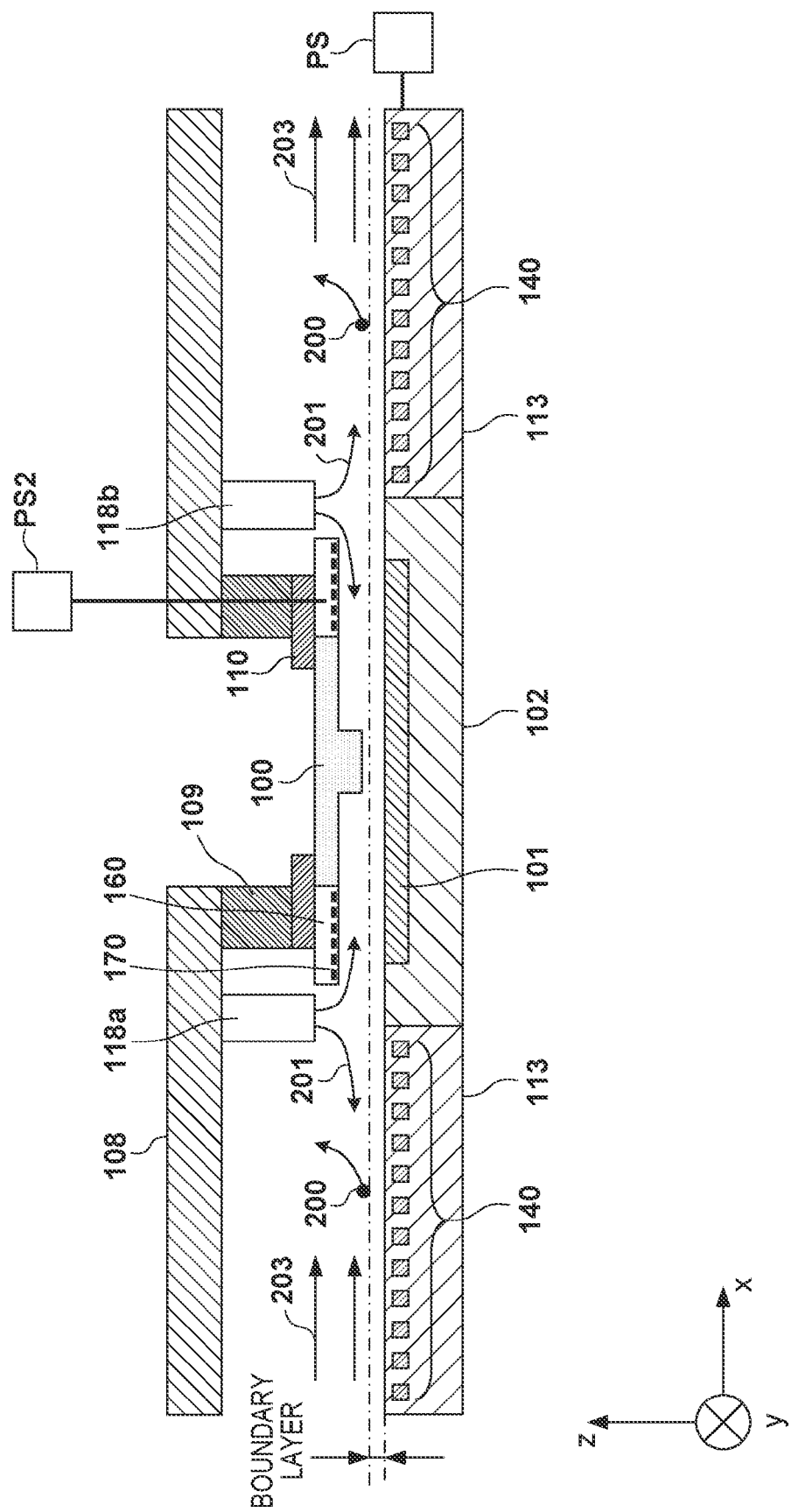

LITHOGRAPHY APPARATUS AND ARTICLE MANUFACTURING METHOD

BACKGROUND OF THE INVENTION

Field of the Invention

The present invention relates to a lithography apparatus and an article manufacturing method.

Description of the Related Art

An exposure apparatus, an imprint apparatus, or the like can be given as a lithography apparatus which transfers the pattern of an original to a substrate. The exposure apparatus is an apparatus which transfers, as a latent image, the pattern of the original to a photoresist (material to be transferred) applied or arranged on the substrate. A resist pattern is formed by developing the photoresist in which the latent image has been formed. The imprint apparatus is an apparatus which forms the pattern of an imprint material (material to be transferred) applied or arranged on the substrate by curing the imprint material in a state in which the original is in contact with the imprint material using the original.

In the lithography apparatus such as the exposure apparatus or the imprint apparatus, if particles are attached to, for example, the substrate, the original, and/or the material to be transferred, an error may occur in a pattern to be formed. Particles in a chamber of the lithography apparatus may enter from the outside of the chamber, or may be generated in the chamber by, for example, the friction between machine elements or the friction between the machine elements and the substrate or the original. Alternatively, the particles may be generated by the material to be transferred.

A boundary layer exists between an airflow and the surfaces of members such as the substrate and the original. If particles which move along the airflow deviate from the flow line of the airflow, the particles enter the boundary layer. Influences on the particles such as a gravity, Brownian diffusion, and static electricity become relatively large inside the boundary layer. Owing to these, the particles may be attached to the surfaces of the members. The attaching forces of the particles to the surfaces of the members are extremely weak, and thus the particles can easily be separated from the surfaces of the members by an external stimulus (a static electricity, airflow, or vibration). The particles separated from the surfaces of the members arranged near the substrate or the original may be attached to the substrate, the original, and/or the material to be transferred.

Patent literature 1 is about an imprint apparatus, and describes an arrangement including a main convex structural part and a sub convex structural part in a mold (original) to trap foreign substances (particles) to the sub convex structural part by charging the sub convex structural part.

In an approach of setting a part of the original as a trapping part and trapping the particles by charging the trapping part like the invention described in patent literature 1, the trapping part which has trapped a large amount of the particles can be a particle source. For example, when a charged state is canceled for some reason, and even when the charged state is not canceled, the particles can be separated from the trapping part and set free by applying a stimulus such as a static electricity, an airflow, or a vibration. Further, as in patent literature 1, if the part of the original is set as the trapping part, the particles can be separated from the trapping part when operating the original. The particles separated from the trapping part may directly be attached to a substrate or the original, or may temporarily be attached to a peripheral member, and then be separated again, resulting in being attached to the substrate or the original.

[Patent Literature 1] Japanese Patent Laid-Open No. 2014-175340

[Non-Patent Literature 1] Masuda, S., Fujibayashi, K., Ishida, K., and Inaba, H., Electric Engineering in Japan, 92, 9 (1972).

[Non-Patent Literature 2] C. I. Calle, J. L. McFall, C. R. Buhler, et al., Proc. ESA Annual Meeting on Electrostatics 2008, Paper O1.

SUMMARY OF THE INVENTION

The present invention provides a technique advantageous in reducing a pattern transfer error caused by particles.

One of aspects of the present invention provides a lithography apparatus which transfers a pattern of an original to a substrate, the apparatus comprising: an electrode structure arranged so as to surround a side surface of one of the substrate and the original; and a power supply configured to supply an alternating voltage to the electrode structure, wherein the electrode structure includes a plurality of electrode groups electrically insulated from each other, each electrode group including a plurality of electrodes electrically connected to each other, and the power supply supplies alternating voltages having different phases to the plurality of electrode groups.

Further features of the present invention will become apparent from the following description of exemplary embodiments with reference to the attached drawings.

BRIEF DESCRIPTION OF THE DRAWINGS

FIG. 9 is a view partially showing the arrangement of an imprint apparatus according to the third embodiment;

FIG. 10 is a view partially showing the arrangement of an imprint apparatus according to the fourth embodiment.

DESCRIPTION OF THE EMBODIMENTS

Exemplary embodiments of the present invention will be described below with reference to the accompanying drawings.

The present invention is applicable to various lithography apparatuses each for transferring the pattern of an original to a substrate under an environment such as an atmospheric-pressure environment, a reduced-pressure environment, or a vacuum environment. For example, an imprint apparatus and an exposure apparatus can be given as such lithography apparatuses. The imprint apparatus forms the pattern of an imprint material (material to be transferred) on the substrate by curing the imprint material on the substrate in a state in which the original is in contact with the imprint material using the original. The exposure apparatus transfers, as a latent image, the pattern of the original to a photoresist (material to be transferred) on the substrate. For example, an exposure apparatus which performs exposure on the photoresist on the substrate by using light such as ultraviolet light or EUV light and an exposure apparatus which performs exposure on the photoresist on the substrate by using a charged particle beam such as an electron beam can be given as the exposure apparatus. The exposure apparatus may be, for example, a projection exposure apparatus or a proximity exposure apparatus. The original is a member having a pattern that should be transferred to the substrate or the material to be transferred on the substrate. The original used in the imprint apparatus can also be referred to as a mold, a die, a template, or the like. The original used in the exposure apparatus can also be referred to as a reticle, a mask, or a photomask. An example will be described below in which the present invention is applied to the imprint apparatus.

Figure 1:
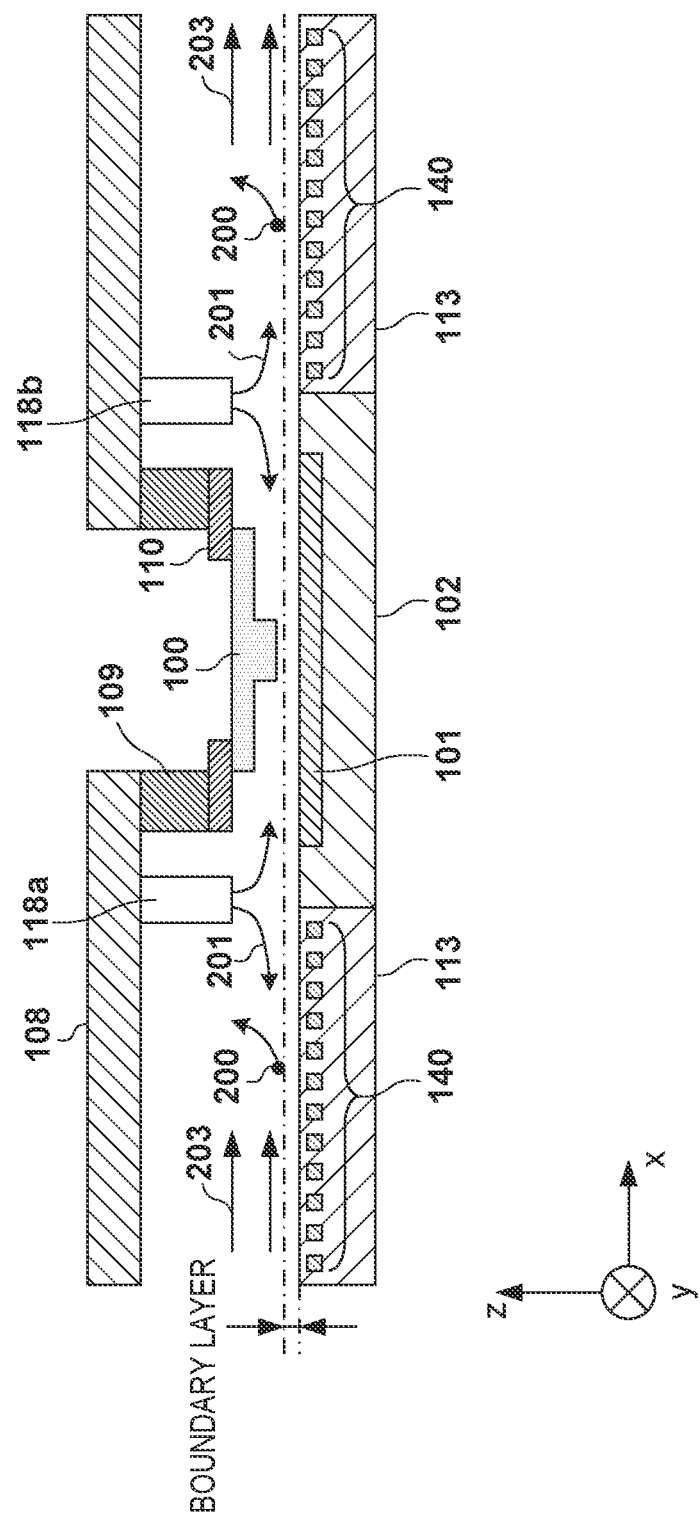
FIG. 1 is a view partially showing the arrangement of an imprint apparatus according to the first and second embodiments.
Figure 3:
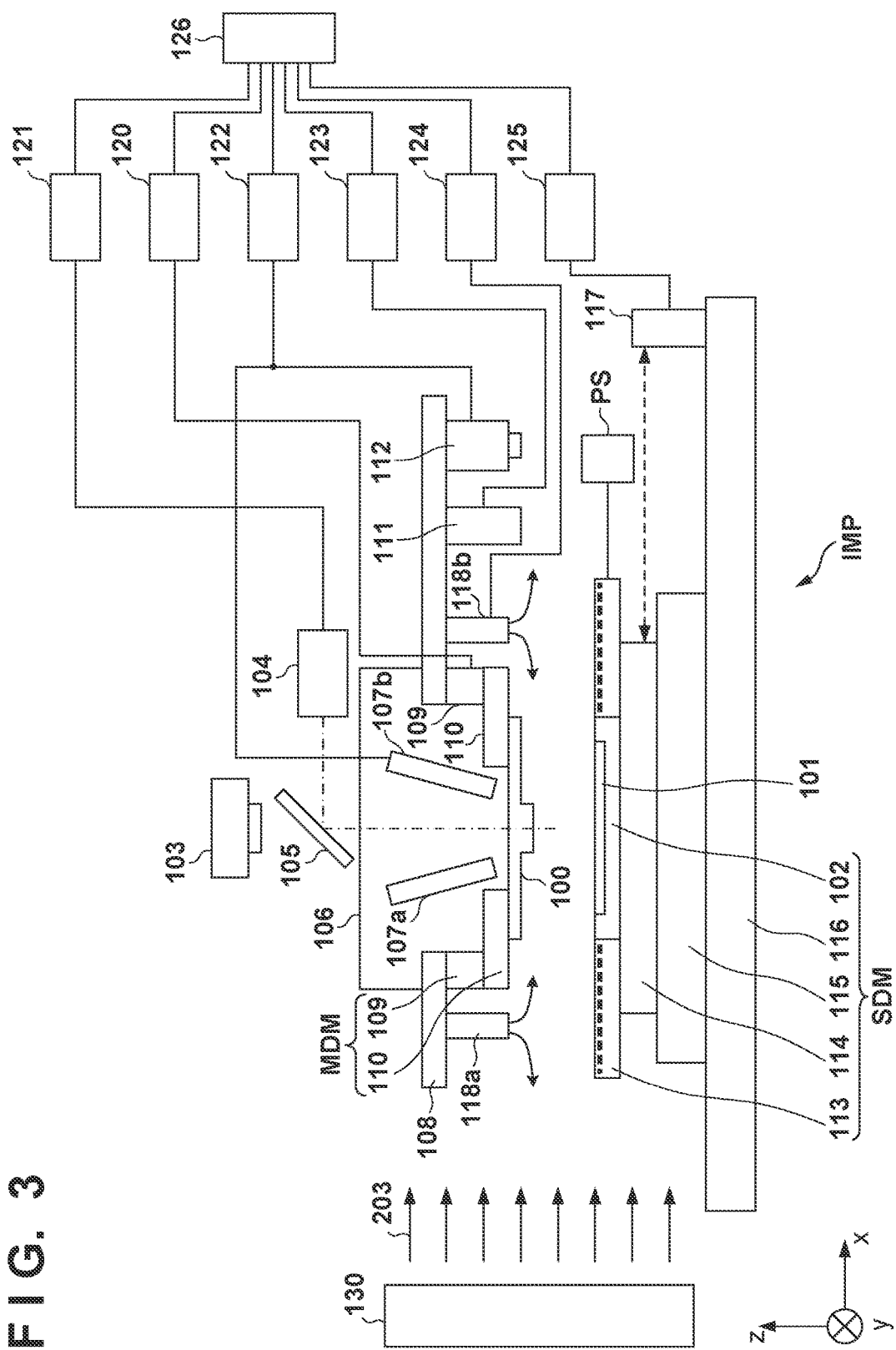
FIG. 3 is a view showing the arrangement of the imprint apparatus according to the first and second embodiments.

FIG. 3 exemplifies the arrangement of an imprint apparatus IMP as one example of the lithography apparatuses. FIG. 1 is a partially enlarged view of FIG. 3. The imprint apparatus IMP transfers the pattern of an original 100 to a substrate 101. Using another expression, the imprint apparatus IMP forms the pattern of an imprint material (material to be transferred) on the substrate 101 using an original 100. The original 100 has a pattern formed by a concave portion. The original 100 is brought into contact with the imprint material (uncured resin) on the substrate 101, thereby filling the concave portion of the pattern with the imprint material. The imprint material is cured by applying, to the imprint material, energy which cures it in this state. Consequently, the pattern of the original is transferred to the imprint material, and a pattern made of the cured imprint material is formed on the substrate 101.

The imprint material is a curable composition which is cured by receiving the energy which cures it. The imprint material may mean the cured imprint material or the uncured imprint material. For example, an electromagnetic wave, heat or the like can be used as the curing energy. The electromagnetic wave can be, for example, light (such as infrared light, visible rays, or ultraviolet light) whose wavelength is selected from a range of 10 nm (inclusive) to 1 mm (inclusive).

Curable compositions are compositions typically cured by light irradiation or application of heat. Out of these compositions, a photo-curable composition that is cured by light can contain at least a polymerizable compound and a photopolymerization initiator. The photo-curable composition can additionally contain a non-polymerizable compound or solvent. The non-polymerizable compound can be, for example, at least a material selected from the group consisting of a sensitizer, a hydrogen donor, an internal mold release agent, a surfactant, an antioxidant, a polymer component, and the like.

In this specification and the accompanying drawings, directions are shown in an X-Y-Z coordinate system in which directions parallel to the surface of the substrate 101 form an X-Y plane. Let the X direction, the Y direction, and the Z direction be the directions parallel to the X-axis, the Y-axis, and the Z-axis, respectively, in the X-Y-Z coordinate system. Let $\theta X$, $\theta Y$, and $\theta Z$, respectively, be rotation about the X-axis, rotation about the Y-axis, and rotation about the Z-axis. Control or driving regarding the X-axis, the Y-axis, and the Z-axis means control or driving regarding the direction parallel to the X-axis, the direction parallel to the Y-axis, and the direction parallel to the Z-axis, respectively. Further, control or driving regarding the $\theta X$-axis, the $\theta Y$-axis, and the $\theta Z$-axis means control or driving regarding rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. An attitude is information that can be specified by rotations relative to the $\theta X$-axis, the $\theta Y$-axis, and the $\theta Z$-axis. Positioning means controlling the position and/or the attitude.

The imprint apparatus IMP includes a substrate driving mechanism SDM which positions the substrate 101. The substrate driving mechanism SDM can include, for example, a substrate chuck 102, a peripheral member 113, a fine moving mechanism 114, a coarse moving mechanism 115, and a base structure 116. The substrate chuck 102 can hold the substrate 101 by suction (for example, vacuum suction or electrostatic attraction). The fine moving mechanism 114 can include a fine moving stage which supports the substrate chuck 102 and the peripheral member 113, and a driving mechanism which drives the fine moving stage. The peripheral member 113 is arranged on the periphery of a region in which the substrate 101 is arranged so as to surround the side surface of the substrate 101. The peripheral member 113 includes an electrode structure 140. The electrode structure 140 is arranged on the periphery of the region in which the substrate 101 is arranged so as to surround the side surface of the substrate 101. The electrode structure 140 can include a plurality of electrode groups electrically insulated from each other. Each electrode group can include a plurality of electrodes electrically connected to each other. The peripheral member 113 can include an insulator member, and the electrode structure 140 can be embedded in the insulator member. The fine moving mechanism 114 is a mechanism which drives the substrate 101 finely by driving the substrate chuck 102 finely. The coarse moving mechanism 115 is a mechanism which drives the substrate 101 coarsely by driving the fine moving mechanism 114 coarsely. The base structure 116 supports the coarse moving mechanism 115, the fine moving mechanism 114, the substrate chuck 102, and the peripheral member 113. The substrate driving mechanism SDM can be configured to, for example, drive the substrate 101 with respect to a plurality of axes (for example, three axes of the X-axis, the Y-axis, and the $\theta Z$-axis). A measuring device 117 such as an interferometer monitors the position of a portion (fine moving stage) integrated with the substrate chuck 102 in the fine moving mechanism 114.

The imprint apparatus IMP can include an original driving mechanism MDM which positions the original 100. The original driving mechanism MDM can include an original chuck (structure) 110 and a driving mechanism 109. A support structure 108 can support the original driving mechanism MDM. The original chuck 110 can hold the original 100 by suction (for example, vacuum suction or electrostatic attraction). The driving mechanism 109 drives the original 100 by driving the original chuck 110. The original driving mechanism MDM can be configured to, for example, drive the original 100 with respect to a plurality of axes (for example, six axes of the X-axis, the Y-axis, the Z-axis, the θX-axis, the θY-axis, and the θZ-axis).

The substrate driving mechanism SDM and the original driving mechanism MDM form a driving unit which positions the substrate 101 and the original 100 relatively. The driving unit adjusts the relative positions of the substrate 101 and the original 100 with respect to the X-axis, the Y-axis, the θX-axis, the θY-axis, and the θZ axis, and also adjusts the relative positions of the substrate 101 and the original 100 with respect to the Z-axis. Adjustment of the relative positions of the substrate 101 and the original 100 with respect to the Z-axis includes an operation of contacting/separating the original 100 and the imprint material on the substrate 101.

The imprint apparatus IMP can include a dispenser (supplier) 111 which applies or supplies the uncured imprint material onto the substrate 101. The dispenser 111 can be configured to, for example, arrange the imprint material on the substrate 101 in a form of a plurality of droplets. The support structure 108 can support the dispenser 111.

The imprint apparatus IMP can include a curing unit 104 which cures the imprint material on the substrate 101 by irradiating the imprint material with light such as UV light. The imprint apparatus IMP can also include a camera 103 configured to observe the state of imprint. Light emitted from the curing unit 104 can be reflected by a mirror 105 and transmitted through the original 100 to irradiate the imprint material. The camera 103 can be configured to observe, via the original 100 and the mirror 105, the state of imprint, for example, a contact state between the imprint material and the original 100 or the like.

The imprint apparatus IMP can include alignment scopes 107a and 107b configured to detect the relative positions of the mark of the substrate 101 and the mark of the original 100. The alignment scopes 107a and 107b can be arranged in an upper structure 106 supported by the support structure 108. The imprint apparatus IMP can include an off-axis scope 112 configured to detect the positions of a plurality of marks of the substrate 101. The support structure 108 can support the off-axis scope 112.

The imprint apparatus IMP can include one or a plurality of blowing portions 118a and 118b. The blowing portions 118a and 118b can be arranged around the original chuck 110 so as to surround the original chuck 110. The blowing portions 118a and 118b can form an airflow curtain such as an air curtain by blowing a gas such as air. For example, the support structure 108 can support the blowing portions 118a and 118b. The imprint apparatus IMP can include a gas supplier 130 which supplies a gas to a space between the substrate 101 and the original 100 such that a gas flow along the substrate 101 is formed in the space.

The imprint apparatus IMP can additionally include a main controller 126, an imprint controller 120, an irradiation controller 121, a scope controller 122, a dispenser controller 123, a curtain controller 124, and a substrate controller 125. The main controller 126 controls the imprint controller 120, the irradiation controller 121, the scope controller 122, the dispenser controller 123, the curtain controller 124, and the substrate controller 125. The imprint controller 120 controls the original driving mechanism MDM. The irradiation controller 121 controls the curing unit 104. The scope controller 122 controls the alignment scopes 107a and 107b, and the off-axis scope 112. The dispenser controller 123 controls the dispenser 111. The curtain controller 124 controls the blowing portions 118a and 118b. The substrate controller 125 controls the substrate driving mechanism SDM.

Airflows 201 by the gas blown from the blowing portions 118a and 118b, and airflows 203 by the gas supplied from the gas supplier 130 can exist in the space between the substrate 101 and the original 100, and its peripheral space. Attachment of particles to the surfaces of the members will be considered here. When the particles exist in the main flow of the controlled airflows, the particles move along that main flow. Therefore, the particles cannot approach the surfaces of the members easily, preventing them from being attached to the surfaces. However, the imprint apparatus IMP is made of various parts. A laminar flow can be formed near the outlet (blowing portion) of the gas supplier 130. However, the various parts may become obstacles as moving away from the outlet, disturbing the airflows and causing stagnation. Therefore, if the particles enter the imprint apparatus IMP, or the particles are generated in the imprint apparatus IMP, the particles deviate from the airflows, and enter the parts and a boundary layer which exists between the airflows and the surfaces of objects such as the parts, the substrate 101, and the original 100. The boundary layer is a layer having a flow velocity lower than that of the main flow and a flow velocity distribution that changes suddenly. Portions near the surfaces of the objects, in particular, have the flow velocities close to 0 because of the viscosity of air. In this case, the particles are largely influenced by a gravity, Brownian diffusion, and static electricity, and are very likely to be attached to the surfaces of the objects. The particles attached to the surfaces of the objects are weak in attaching force and can easily be separated from the surfaces of the objects by an external stimulus (a static electricity, an airflow, or a vibration).

In the first embodiment, the electrode structure 140 is embedded in the insulator member of the peripheral member 113 arranged so as to surround the side surface of the substrate 101, and alternating voltages having different phases are supplied to the plurality of electrode groups of the electrode structure 140. By doing so, an alternating electric field is formed on the surface of the peripheral member 113 to repel particles 200 that have entered the boundary layer on the surface of the peripheral member 113. Consequently, the particles 200 are returned to the main flow and move along the main flow. Therefore, a phenomenon in which the particles 200 are separated from the surfaces of the members present on the periphery of the substrate 101 after being attached to them and are attached to the substrate 101, the original 100, or the imprint material is prevented or reduced.

Part or all of the peripheral member 113 can be made of the insulator member, and the electrode structure 140 is embedded in the insulator member. The peripheral member 113 (insulator member) can be formed so as to have a flat surface S. The surface S preferably has the same height as the surface of the substrate 101. An embedding form may be a form in which the electrode structure 140 is buried completely under the surface of the insulator member or may be a form in which the surface of the electrode structure 140 is exposed. The electrode structure 140 can include the plurality of electrode groups electrically insulated from each other. The electrode structure 140 can include an electrode group (group a) formed by electrodes 10a, 11a, 12a, 13a, 14a, 15a . . . electrically connected to each other and an electrode group (group b) formed by electrodes 10*b*, 11*b*, 12*b*, 13*b*, 14*b*, 15*b* . . . electrically connected to each other.

Figure 2:
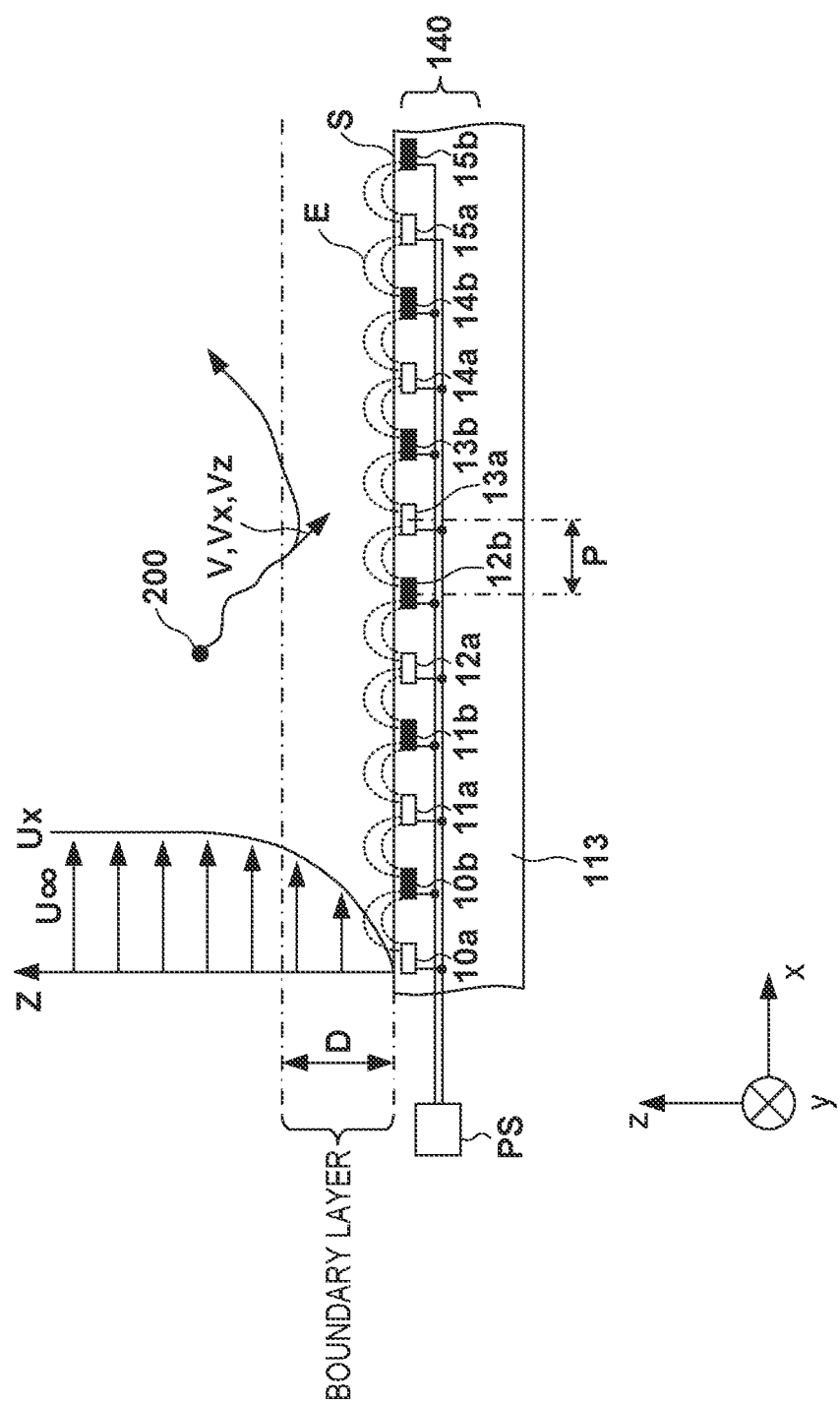
FIG. 2 is a view for explaining the principle of preventing or reducing attachment of a particle in the imprint apparatus according to the first embodiment.

In FIG. 2, Ux indicates a flow velocity distribution of an airflow formed near the surface of the peripheral member 113. Each E indicates an electric field formed by supplying the alternating voltage to the electrode structure 140. D indicates a thickness of the boundary layer between the surface of the peripheral member 113 and the main flow of the airflows. P indicates an array pitch between electrodes in the plurality of electrode groups of the electrode structure 140. V (Vx, Vz) indicates a moving speed of the particle 200 in the boundary layer, and Vx indicates a speed in the X direction, and Vz indicates a speed in the Z direction.

A power supply PS can be configured to supply alternating voltages having a phase difference $\pi$ to the group a and the group b of the electrode structure 140. In a certain half cycle of each alternating voltage, a positive voltage is applied to the group a, and a negative voltage is applied to the group b, generating the non-uniform electric field curved from the group a to the group b. In a next half cycle, the non-uniform electric field curved from the group b to the group a is generated. That is, the electric fields E formed on the surface of the electrode structure 140 (peripheral member 113) form a standing wave.

If the charged particle 200 comes flying near the surface on which such electric fields E are formed, the particle 200 receives a force along the electric fields E. On the other hand, if the uncharged particle 200 comes flying, a gradient force is generated because the electric fields E are the non-uniform electric fields. As a result, the particle 200 receives a force in a direction away from the electrode structure 140. Such a technique is called an electric field curtain (non-patent literatures 1 and 2). Upon receiving such a force, the particle 200 is not easily attached to but moves away from the surfaces of the members. Therefore, the particle 200 that has entered the boundary layer is repelled from the boundary layer and moves along the main flow of the airflows.

In general, the thickness D of the boundary layer is given by:

$$D = 3\sqrt{(vx/U_\infty)} \tag{1}$$

where $U_\infty$ is a speed of the main flow, $v$ is a dynamic viscosity of the gas, and $x$ is a distance from the end of the peripheral member 113. The array pitch P between the electrodes in the plurality of electrode groups of the electrode structure 140 is preferably smaller than the boundary layer thickness D. The array pitch P is a distance between the centers of the adjacent electrodes.

If the array pitch P is larger than the boundary layer thickness D, it becomes difficult to form the electric fields E each having an intensity needed to return the particle 200 in the boundary layer to the main flow of the airflows, increasing a possibility that the particle 200 is attached to the surface of the peripheral member 113. On the other hand, if the array pitch P is smaller than the boundary layer thickness D, it is easy to form the electric fields E each having the intensity needed to return the particle 200 in the boundary layer to the main flow of the airflows.

Furthermore, a design for the array pitch P can be considered as follows. In FIG. 2, the electric fields E are indicated by dotted electric flux lines. An arrangement is preferable in which many of the electric flux lines generated between the electrode group (group a) of 10*a* to 15*a* and the electrode group (group b) of 10*b* to 15*b* are closed on the surface of the peripheral member 113. For example, when members facing the electrodes (to be referred to as facing members hereinafter) approach them as the substrate 101 (substrate chuck 102) moves, a potential near those facing members is kept at nearly 0 V if many of electric flux lines are closed. However, if the number of closed electric flux lines is small, the number of electric flux lines entering the facing members increases, generating the electric fields between the electrodes and the facing members. In this case, if the particle 200 exists in the space between the electrodes and the facing members, the particle 200 may move along the electric flux lines and be attached to the facing members. It is therefore preferable that the array pitch P is made smaller than the distance between the flat surface S of the peripheral member 113 and the members (for example, the blowing portions 118*a* and 118*b*, the original chuck 110, and the original 100) that can face the surface S.

A parameter preferable from another viewpoint will be considered below. The speed of the particle 200 is defined as V (Vx, Vz) as in FIG. 2. A speed Vz of the particle 200 in the z direction near the surface of the peripheral member 113 in the boundary layer is given by a sum $V_G + V_B + V_E$, where $V_G$ is a moving speed by a gravity (gravity settling speed), $V_B$ is a moving speed by the Brownian diffusion, and $V_E$ is a moving speed by the electric fields. The physical property of the gas (typically the air) that forms the airflows is constant, and it is thus considered that this Vz depends on a particle diameter and the generated electric fields E. An estimation can be given by:

$$V_G = C_c \rho_P D_P^2 g/(18v) \tag{2}$$

where $C_c$ is a dimensionless number referred to as a Cunningham correction factor and is a number that should be considered when the diameter of the particle 200 and the order of an ambient gas in a mean free path becomes almost the same, $\rho_P$ is a density of the particle 200, $D_p$ is a diameter of the particle 200, and g is a gravitational acceleration.

$V_B$ is given by:

$$V_B = \sqrt{(4C_c kT/(3\pi^2 v D_p))} \tag{3}$$

where k is a Boltzmann's factor, and T is a gas temperature.

$V_E$ is given by:

$$V_E = C_c p e E_{max}/(3\pi v D_p) \tag{4}$$

where p is the number of charges of the particle, and although the number of charges of the particle 200 generated in the imprint apparatus IMP is unknown, the average number of charges dependent on the diameter $D_p$ of the particle 200 is assumed here, e is an elementary charge amount, and $E_{max}$ is a maximum value of an electric field intensity generated in the boundary layer.

Vz can be estimated by utilizing equations (2) to (4) above. Thus, letting t be a moving time required for the particle 200 to reach the surface of the peripheral member 113, an approximation can be made as t~D/Vz. If the direction of each electric field does not change during this moving time t, the particle 200 is attached to the surface of the peripheral member 113 directly. In order to prevent the particle 200 from being attached to the surface of the peripheral member 113, the direction of each electric field needs to be changed during the moving time t. Therefore, letting T be a cycle of the alternating voltage supplied to the electrode structure 140, T<t should be satisfied.

Alternatively, a preferable frequency of the alternating voltage supplied to the electrode structure 140 can also be considered as follows. The dominant component in the moving speed of the particle 200 is the moving speed $V_E$ by the electric fields. When an ionizer is installed near the peripheral member 113 (electrode structure 140), the ionizer makes a charge distribution generally follow a Boltzmann's equilibrium charge distribution even if the generated particle 200 includes biased charges. In this case, the average number of charges can be estimated. A largest particle diameter p/$D_p$ in equation (4) is 50 nm, and thus $V_E$ is estimated by utilizing the particle diameter $D_p$=50 nm and the average number of charges p=0.411. If each electric field E is, for example, 1×10$^6$ V/m, $V_E$=3.8×10$^{-2}$ m/sec. is obtained.

If the distance between the peripheral member 113 and the facing members facing this is 2 mm, t=2.6×10$^{-2}$ sec. is obtained in order to prevent the particle 200 positioned in the middle of this from being attached to both the peripheral member 113 and the facing members. That is, it is only necessary to supply an alternating voltage having a frequency of about 1/t=38 Hz to the electrode structure 140. As described above, the frequency of the alternating voltage supplied by the power supply PS to the electrode structure 140 can be decided based on the specifications of the imprint apparatus IMP. In an experiment conducted by the present inventor, an effect of preventing the particle 200 from being attached to the peripheral member 113 and the facing members by setting the main half cycle of the alternating voltage supplied by the power supply PS to the electrode structure 140 within a range of 1 to 1,000 Hz was confirmed.

Figure 4A:
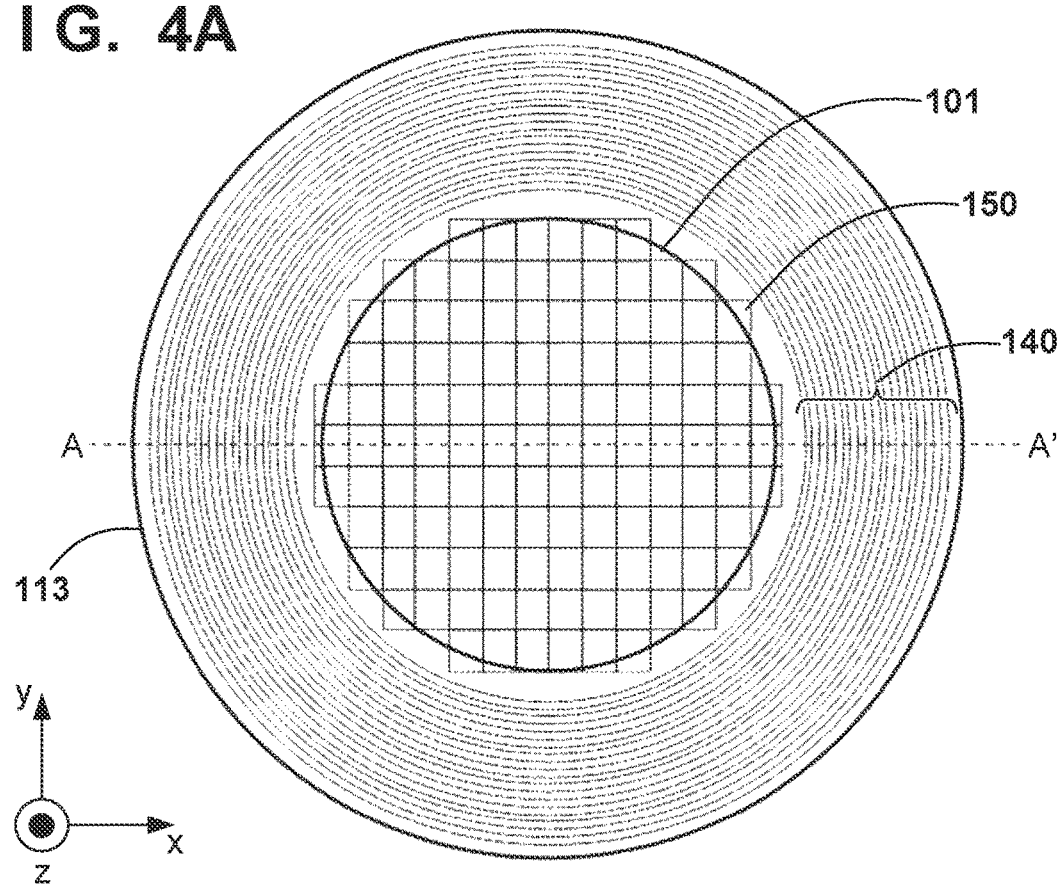
FIGS. 4A and 4B are views showing an example of the arrangement of a substrate chuck and a peripheral member according to the first embodiment.
Figure 4B:
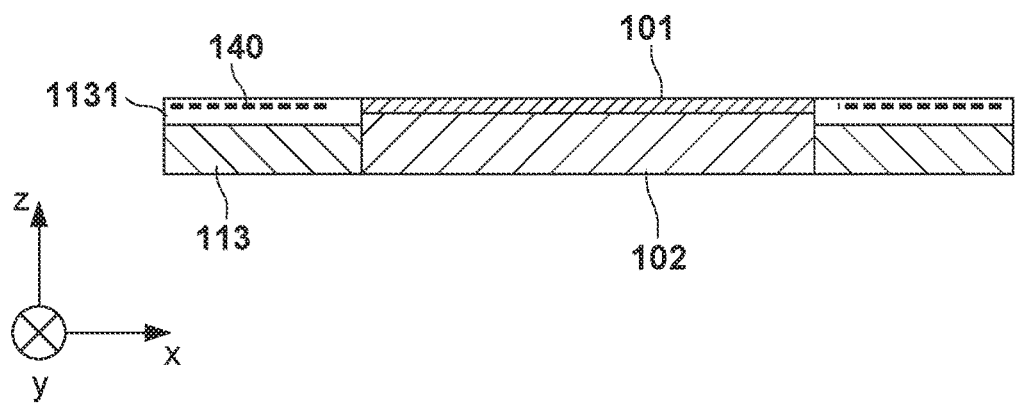

FIGS. 4A and 4B show an example of the arrangement of the substrate chuck 102 and the peripheral member 113. FIG. 4A is a plan view, and FIG. 4B is a sectional view. FIG. 4A shows a shot array (array of shot regions) 150 as a reference. The peripheral member 113 includes an insulator member 1131, and the electrode structure 140 is embedded in the insulator member 1131. The peripheral member 113 is arranged around the substrate chuck 102 so as to surround the substrate chuck 102 (substrate 101). The electrode structure 140 is arranged around the substrate chuck 102 so as to surround the substrate chuck 102 (substrate 101). The electrode structure 140 can also be arranged outside the shot array 150 so as to surround the shot array 150. The plurality of electrode groups which form the electrode structure 140 are arranged concentrically. The peripheral member 113 preferably has the flat surface such that an air flow with less disturbance is formed on the peripheral member 113.

Figure 5:
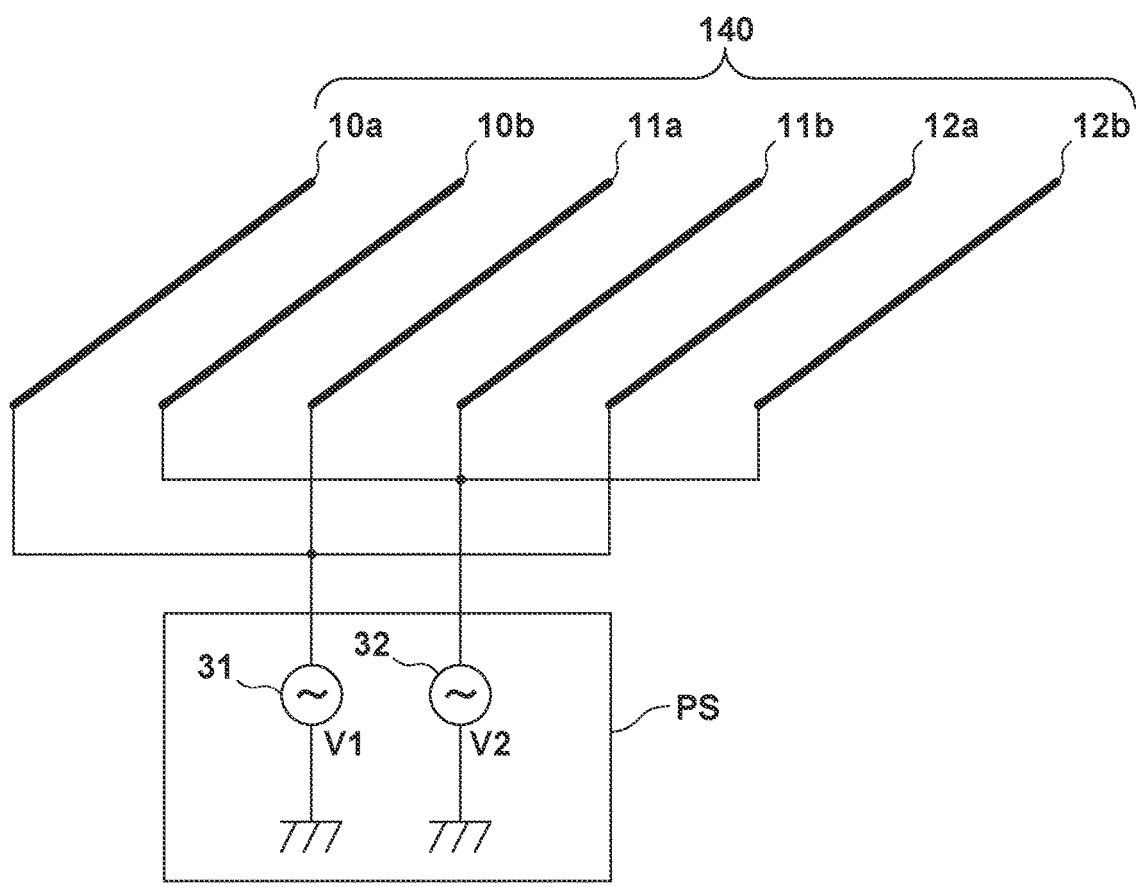
FIG. 5 is a view showing an example of connection between a power supply and a plurality of electrode groups of an electrode structure according to the first embodiment.
Figure 6:
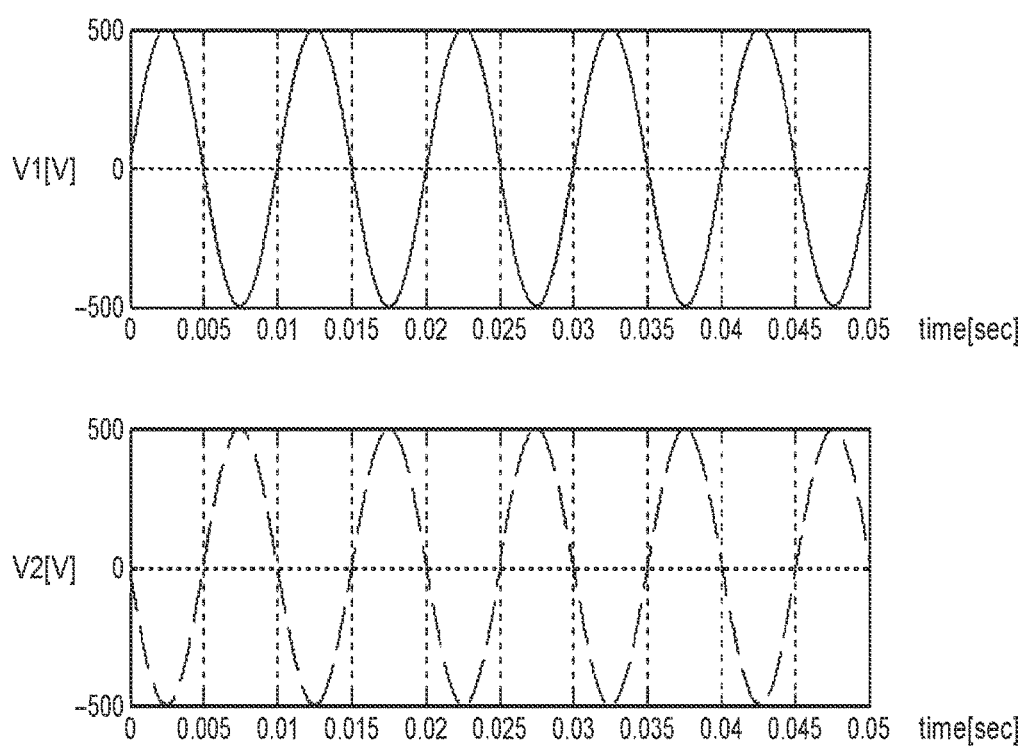
FIG. 6 shows graphs each exemplifying an alternating voltage supplied from the power supply to the plurality of electrode groups of the electrode structure according to the first embodiment.

FIG. 5 shows an example of connection between the power supply PS and the plurality of electrode groups (the group a and the group b) in the electrode structure 140. FIG. 6 exemplifies alternating voltages supplied from the power supply PS to the plurality of electrode groups (the group a and the group b) of the electrode structure 140. In the example shown in FIG. 5, the electrode structure 140 is formed by two electrode groups (the group a and the group b). The power supply PS includes a first power supply 31 and a second power supply 32. The first power supply 31 supplies a first alternating voltage V1 to the plurality of electrodes 10a, 11a, and 12a electrically connected to each other so as to form the group a. The second power supply 32 supplies a second alternating voltage V2 to the plurality of electrodes 10b, 11b, and 12b electrically connected to each other so as to form the group b. In one example, each of the first alternating voltage V1 and the second alternating voltage V2 has a frequency of 100 Hz and an amplitude of ±500 V, and their phase difference is π. A standing wave having a curved non-uniform electric field is formed by supplying the alternating voltages having the phase difference π to the electrodes in the group a and the electrodes in the group b. The particles are repelled from the boundary layer by this electric field.

Figure 11A:
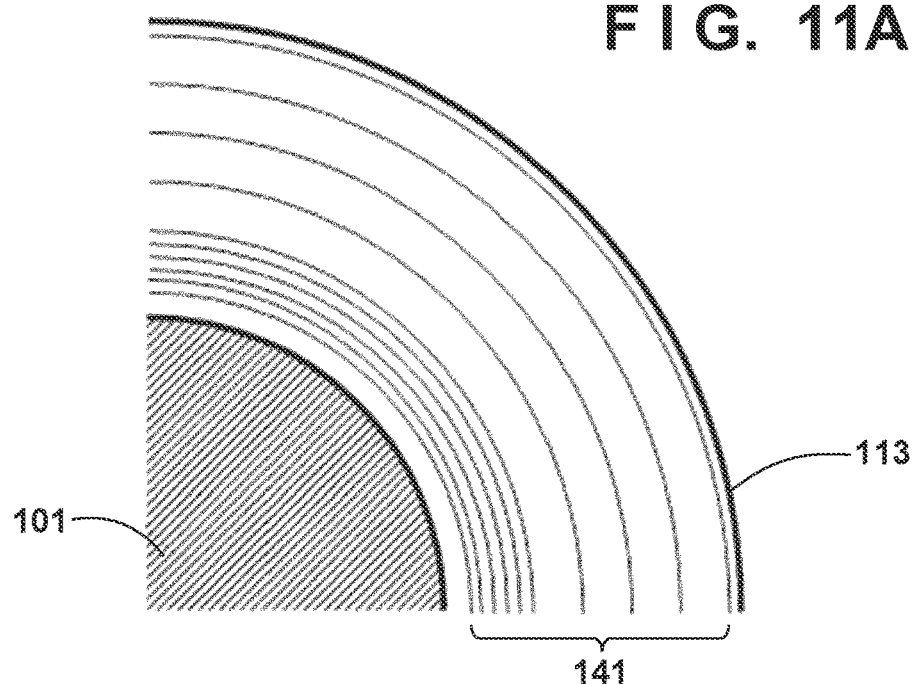
FIGS. 11A and 11B are views each showing an example of the arrangement of electrodes.
Figure 11B:
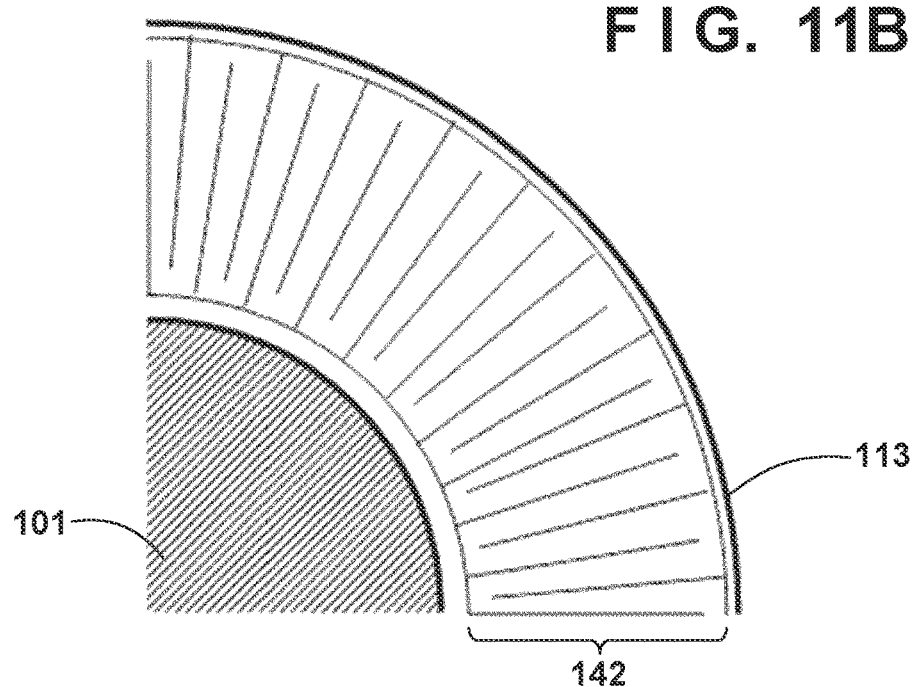

In the example shown in FIGS. 4A and 4B, the electrodes which form the plurality of electrode groups of the electrode structure 140 are arranged concentrically at regular intervals. However, this is merely an example. For example, when a sensor, a mark, and the like are provided in the peripheral member 113, the electrodes which form the plurality of electrode groups are not necessarily arranged concentrically at regular intervals in order to arrange the electrodes so as to avoid them. For example, like an electrode structure 141 of FIG. 11A, the electrodes which form the plurality of electrode groups can be arranged concentrically but at irregular intervals. Alternatively, like an electrode structure 142 of FIG. 11B, the respective electrodes which form the plurality of electrode groups may extend radially. Alternatively, the region of the peripheral member 113 may be divided into a plurality of regions, and the plurality of electrode groups may be arranged in the respective regions.

Figure 7:
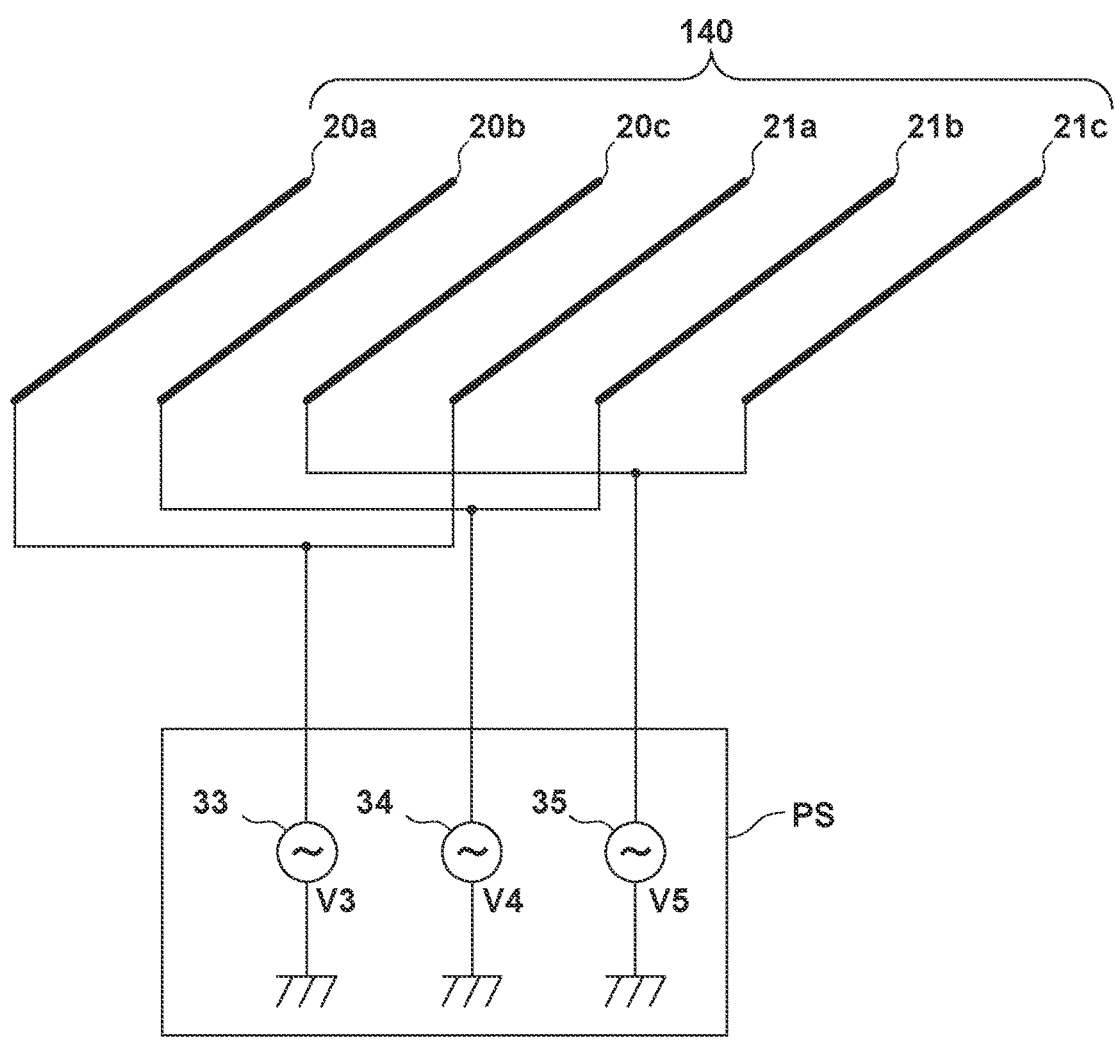
FIG. 7 is a view showing an example of connection between a power supply and a plurality of electrode groups of an electrode structure according to the second embodiment.
Figure 8:
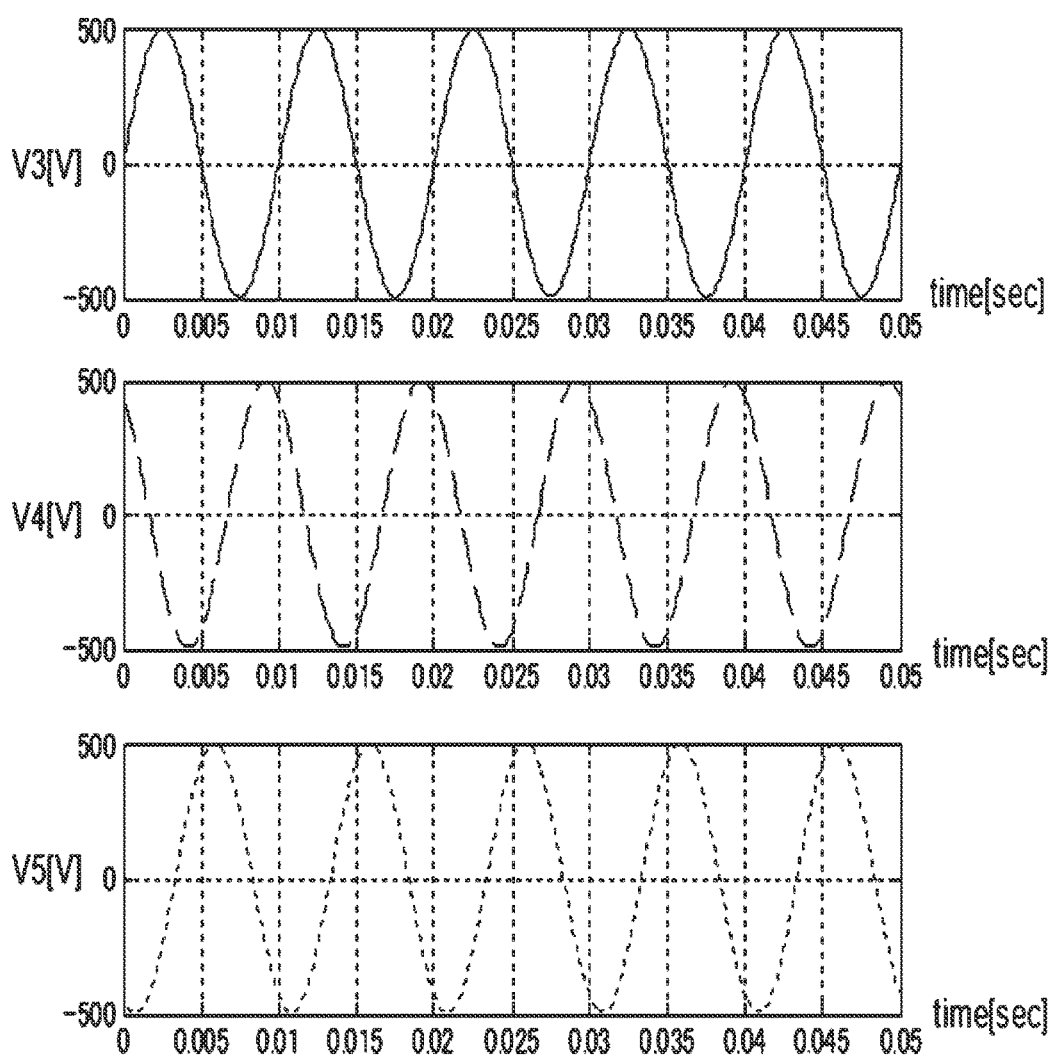
FIG. 8 shows graphs each exemplifying an alternating voltage supplied from the power supply to the plurality of electrode groups of the electrode structure according to the second embodiment.

The second embodiment of the present invention will be described with reference to FIGS. 7 and 8. Matters that are not mentioned in the second embodiment can comply with the first embodiment. In the second embodiment, an electrode structure 140 includes three electrode groups as a plurality of electrode groups. In other words, the electrode structure 140 of the second embodiment has a three-phase arrangement. More specifically, the electrode structure 140 of the second embodiment includes the electrode groups of a group a, a group b, and a group c. The group a is the electrode group formed by electrodes 20a, 21a . . . electrically connected to each other. The group b is the electrode group formed by electrodes 20b, 21b . . . electrically connected to each other. The group c is the electrode group formed by electrodes 20c, 21c . . . electrically connected to each other.

A power supply PS includes a first power supply 33, a second power supply 34, and a third power supply 35. The first power supply 33 supplies a first alternating voltage V3 to the plurality of electrodes 20a, 21a . . . electrically connected to each other so as to form the group a. The second power supply 34 supplies a second alternating voltage V4 to the plurality of electrodes 20b, 21b . . . electrically connected to each other so as to form the group b. The third power supply 35 supplies a third alternating voltage V5 to the plurality of electrodes 20c, 21c . . . electrically connected to each other so as to form the group c. In one example, each of the first alternating voltage V3, the second alternating voltage V4, and the third alternating voltage V5 has a frequency of 100 Hz and an amplitude of ±500 V, and their phase difference is 2π/3. The second alternating voltage V4 leads the first alternating voltage V3 by 2π/3 in phase difference. The third alternating voltage V5 leads the second alternating voltage V4 by 2π/3 in phase difference. The electrode groups are arranged like the group a, the group b, the group c, the group a, the group b, the group c . . . from the side of a substrate 101.

In the arrangement described above, the power supply PS supplies the alternating voltages V3, V4, and V5 to the electrode structure 140, generating a traveling wave. That traveling wave travels in a direction away from the substrate 101. Particles receive forces in a direction to repel from a boundary layer and move while receiving forces in a direction along the traveling wave, that is, the direction away from the substrate 101. It is therefore possible, according to the second embodiment, to return the particles from the boundary layer to a main flow more effectively than in the first embodiment.

The third embodiment of the present invention will be described with reference to FIG. 9. Matters that are not mentioned in the third embodiment can comply with the first or second embodiment. In the third embodiment, so as to surround the side surface of an original 100, an electrode structure 170 arranged on the periphery of a region such that the original 100 is arranged is included, the electrode structure 170 includes a plurality of electrode groups electrically insulated from each other, and each electrode group includes a plurality of electrodes electrically connected to each other. A peripheral member 160 includes an insulator member, and the electrode structure 170 is embedded in the insulator member. The peripheral member 160 can have a flat surface (lower surface). The surface preferably has the same height as a peripheral portion in the original 100. A power supply PS2 which supplies an alternating voltage to the electrode structure 170 can have the same arrangement as the power supply PS in the first embodiment.

In an imprint apparatus IMP, the original 100 repeatedly contacts an imprint material on a shot region and separates from the imprint material each time imprint is performed on the imprint material. Therefore, it is also considered that the original 100 applies an antistatic apparatus such as an ionizer in order to remove this charging that is likely to be charged. It may be difficult, however, for the ionizer to remove charging sufficiently in consideration of a small gap between a substrate 101 and the original 100. Further, the narrow gap between the substrate 101 and the original 100 may cause a large potential gradient in the gap between the substrate 101 and the original 100, resulting in particles being attached to the original 100.

As in the first embodiment, also in the third embodiment, an array pitch P between the electrodes in the plurality of electrode groups of the electrode structure 170 is preferably smaller than a boundary layer thickness D. Additionally, the array pitch P is preferably made smaller than the distance between the flat surface of the peripheral member 160 and members (for example, the substrate 101 and a peripheral member 113) that can face the surface.

Regarding a speed V (Vx, Vz) of the particles, a moving speed by a gravity (gravity settling velocity) is in a direction moving away from the peripheral member 160. Therefore, a total moving speed Vz is given by a sum $-V_G+V_B+V_E$, where $-V_G$ is a moving speed by the gravity, $V_B$ is a moving speed by a Brownian diffusion, and $V_E$ is a moving speed by an electric field. This Vz can be estimated to some extent by using equations (2) to (4) described above.

Thus, letting t be a moving time required for particles 200 to reach the surface of the peripheral member 160, an approximation can be made as t~D/Vz. If the direction of the electric field does not change during this moving time t, the particles 200 are attached to the surface of the peripheral member 160 directly. In order to prevent the particles 200 from being attached to the surface of the peripheral member 160, the direction of the electric field needs to be changed during the moving time t. Therefore, letting T be a cycle of the alternating voltage supplied to the electrode structure 170, T<t should be satisfied.

According to the third embodiment, the electric field which is generated by the electrode structure 170 embedded in the peripheral member 160 arranged around the original 100 prevents or reduces attachment of the particles 200 to the peripheral member 160. Then, the particles 200 move away, along the main flow of airflows, from the periphery of the substrate 101 and the original 100. Therefore, attachment of the particles 200 to the substrate 101, the original 100, and the imprint material is prevented or reduced.

The fourth embodiment of the present invention will be described with reference to FIG. 10. The fourth embodiment is obtained by combining the first or second embodiment and the third embodiment. That is, an imprint apparatus IMP of the fourth embodiment includes an electrode structure 140 which is arranged in a peripheral member 113 arranged so as to surround a substrate 101 and an electrode structure 170 which is arranged in a peripheral member 160 arranged so as to surround an original 100. A power supply PS and a second power supply PS2 supply alternating voltages to the electrode structures 140 and 170. According to the fourth embodiment, attachment of particles 200 to the peripheral member 113 arranged on the periphery of the substrate 101 and attachment of the particles 200 to the peripheral member 160 arranged on the periphery of the original 100 are prevented or reduced. Then, the particles 200 move away, along the main flow of airflows, from the periphery of the substrate 101 and the original 100. Therefore, attachment to the substrate 101, the original 100, and an imprint material is prevented or reduced.

As exemplarily described through each of the first to fourth embodiments, a lithography apparatus of the present invention can include an electrode structure arranged so as to surround the side surface of one of a substrate and an original, and a power supply which supplies an alternating voltage to the electrode structure. The electrode structure can include a plurality of electrode groups electrically insulated from each other. Each electrode group can include a plurality of electrodes electrically connected to each other. The power supply can supply alternating voltages having different phases to the plurality of electrode groups. The lithography apparatus of the present invention can also include the second electrode structure arranged so as to surround the side surface of the other of the substrate and the original, and the second power supply which supplies an alternating voltage to the second electrode structure. The second electrode structure can include a plurality of second electrode groups electrically insulated from each other. Each of the second electrode groups can include a plurality of electrodes electrically connected to each other. The second power supply can supply alternating voltages having different phases to the plurality of electrode groups.

An article manufacturing method of manufacturing an article by using the lithography apparatus such as the above-described imprint apparatus will be described below. The article manufacturing method can include a step of forming a pattern on the substrate by using the lithography apparatus and a step of processing (performing, for example, etching, ion implantation, or oxidation) the substrate on which the pattern has been formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-028297, filed Feb. 17, 2016, which is hereby incorporated by reference herein in its entirety.

What is claimed is:

1. A lithography apparatus which transfers a pattern of an original to a substrate, the apparatus comprising:
a substrate holding unit configured to hold the substrate;
an original holding unit configured to hold the original;
an electrode structure arranged so as to surround a side surface of one of the substrate or the original; and a power supply configured to supply an alternating voltage to the electrode structure in a state where the substrate is held by the substrate holding unit and the original is held by the original holding unit,
wherein the electrode structure includes a plurality of electrode groups electrically insulated from each other, each electrode group including a plurality of electrodes electrically connected to each other, and
wherein the power supply supplies alternating voltages having different phases to the plurality of electrode groups.

2. The apparatus according to claim 1, further comprising a peripheral member arranged so as to surround the side surface of the one of the substrate or the original,
wherein the peripheral member includes an insulator member, and the electrode structure is embedded in the insulator member.

3. The apparatus according to claim 2, wherein the peripheral member has a flat surface.

4. The apparatus according to claim 3, wherein an array pitch between the electrodes in the plurality of electrode groups is smaller than a distance between a member that can face the flat surface of the peripheral member and the surface.

5. The apparatus according to claim 1, wherein a frequency of the alternating voltage supplied to each electrode group by the power supply falls within a range of 1 to 1,000 Hz.

6. The apparatus according to claim 1, further comprising a gas supplier configured to supply a gas to a space between the substrate and the original such that a gas flow along the substrate is formed in the space.

7. The apparatus according to claim 6, further comprising a blowing portion arranged so as to surround the original and configured to blow the gas.

8. The apparatus according to claim 1, further comprising a second electrode structure arranged so as to surround a side surface of the other of the substrate or the original,
wherein the second electrode structure includes a plurality of second electrode groups electrically insulated from each other, each of the second electrode groups including a plurality of second electrodes electrically connected to each other, and
the power supply supplies alternating voltages having different phases to the plurality of second electrode groups.

9. The apparatus according to claim 1, wherein the electrodes which form the plurality of electrode groups are arranged concentrically.

10. The apparatus according to claim 1, wherein the respective electrodes which form the plurality of electrode groups extend radially.

11. The apparatus according to claim 1, wherein the plurality of electrode groups form a standing wave of an electric field.

12. The apparatus according to claim 1, wherein the plurality of electrode groups form a traveling wave of an electric field.

13. The apparatus according to claim 12, wherein the traveling wave is formed so as to travel in a direction away from the one of the substrate and the original.

14. An article manufacturing method comprising:
forming a pattern on a substrate by using a lithography apparatus; and
processing the substrate on which the pattern has been formed,
wherein the lithography apparatus is configured to transfer a pattern of an original to the substrate and comprises:
a substrate holding unit configured to hold the substrate;
a original holding unit configured to hold the original;
an electrode structure arranged so as to surround a side surface of one of the substrate or the original; and
a power supply configured to supply an alternating voltage to the electrode structure in a state that the substrate is held by the substrate holding unit and the original is held by the original holding unit,
wherein the electrode structure includes a plurality of electrode groups electrically insulated from each other, each electrode group including a plurality of electrodes electrically connected to each other, and
wherein the power supply supplies alternating voltages having different phases to the plurality of electrode groups.

15. The apparatus according to claim 1, further comprising a peripheral member arranged so as to surround a side surface of the substrate holding unit, the peripheral member including an insulator having an upper surface,
wherein the electrode structure is embedded in the insulator so as to surround the side surface of the substrate holding unit, and
wherein the upper surface is higher than a lower surface of the substrate held by the substrate holding unit.

16. The apparatus according to claim 2,
wherein the peripheral member is arranged so as to surround a side surface of the substrate holding unit.

17. The apparatus according to claim 1, further comprising a peripheral member arranged so as to surround a side surface of the original held by the original holding unit, the peripheral member including an insulator having a lower surface,
wherein the electrode structure is embedded in the insulator so as to surround the side surface of the original held by the original holding unit, and
wherein the lower surface is lower than an upper surface of the original held by the original holding unit.

18. The apparatus according to claim 2,
wherein the peripheral member is arranged so as to surround a side surface of the original held by the original holding unit.

19. The apparatus according to claim 1, wherein the apparatus is an imprint apparatus.

* * * * *